(12) United States Patent
Yoneda et al.

(10) Patent No.: US 7,727,911 B2
(45) Date of Patent: Jun. 1, 2010

(54) METHOD FOR FORMING A GATE INSULATING FILM

(75) Inventors: Kenji Yoneda, Kyoto (JP); Kazuhiko Yamamoto, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/349,192

(22) Filed: Jan. 6, 2009

(65) Prior Publication Data

US 2009/0181549 A1    Jul. 16, 2009

(30) Foreign Application Priority Data

Jan. 10, 2008    (JP)    ............... 2008-003336

(51) Int. Cl.
*H01L 21/31* (2006.01)
(52) U.S. Cl. ............... 438/785; 438/591; 257/E21.191; 257/E21.625; 257/E21.639
(58) Field of Classification Search ................. 438/287, 438/591, 761, 763, 770, 778, 785; 257/E21.191, 257/E21.625, E21.639
See application file for complete search history.

(56) References Cited

U.S. PATENT DOCUMENTS

| 6,858,547 | B2 * | 2/2005 | Metzner et al. ............. 438/785 |
| 2002/0115252 | A1 | 8/2002 | Haukka et al. |
| 2005/0235905 | A1 | 10/2005 | Senzaki et al. |
| 2006/0046421 | A1 | 3/2006 | Iino et al. |
| 2006/0199384 | A1 | 9/2006 | Ando et al. |
| 2006/0228888 | A1 | 10/2006 | Lee et al. |

* cited by examiner

*Primary Examiner*—Quoc D Hoang
(74) *Attorney, Agent, or Firm*—McDermott Will & Emery LLP

(57) ABSTRACT

In formation of a gate insulating film made of a high dielectric constant metal silicate, atomic layer deposition (ALD) is performed by setting exposure time to a precursor containing a metal or the like to saturation time of a deposition rate by a surface adsorption reaction and by setting exposure time to an oxidizing agent to time required for a composition of a metal oxide film to reach 97% or more of a stoichiometric value.

14 Claims, 13 Drawing Sheets

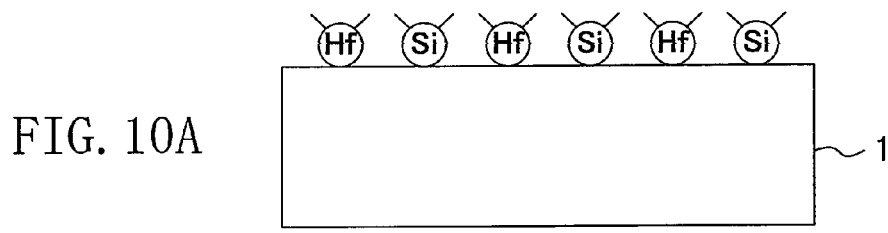
FIG. 10A
FIG. 10B
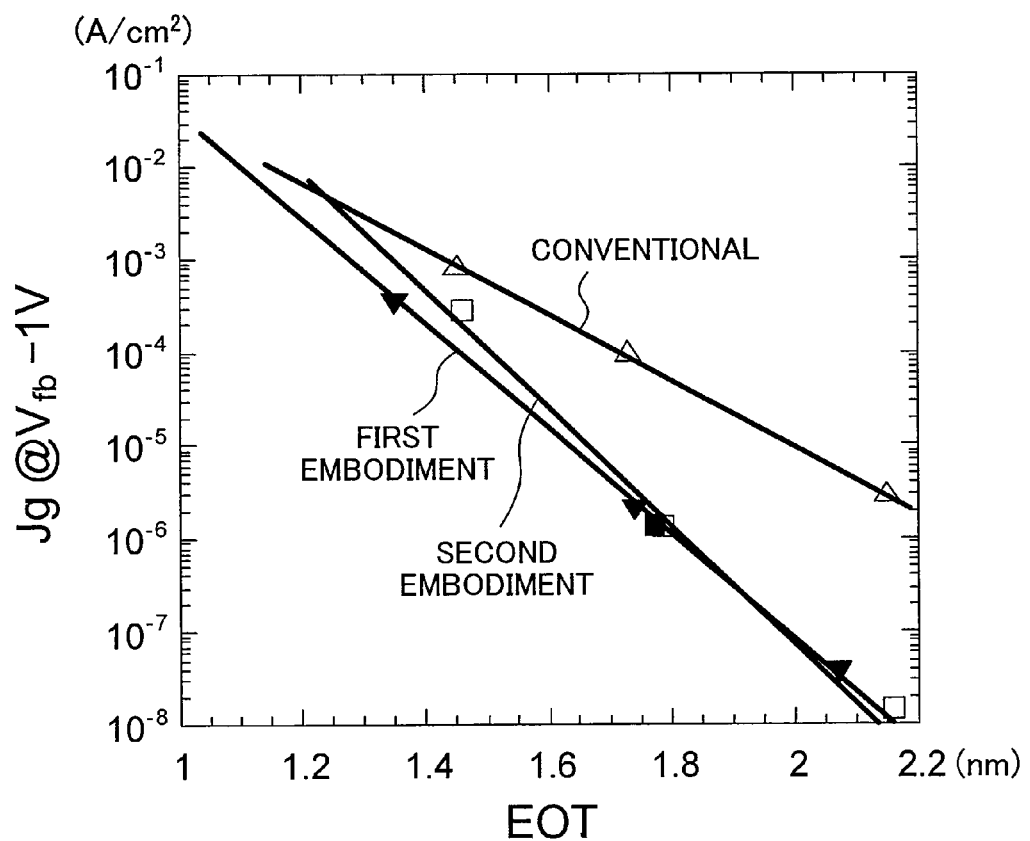
FIG. 11

METHOD FOR FORMING A GATE INSULATING FILM

CROSS-REFERENCE TO RELATED APPLICATIONS

This application claims priority under 35 U.S.C. §119(a) on Japanese Patent Application No. 2008-3336 filed on Jan. 10, 2008, the entire contents of which are hereby incorporated by reference.

BACKGROUND OF THE INVENTION

1. Field of the Invention

The present invention generally relates to a method for forming a gate insulating film. More particularly, the present invention relates to a method for forming a gate insulating film made of a high dielectric constant metal silicate or a high dielectric constant metal oxide.

2. Related Art

With recent improvement in integration degree, functions, and operation speed of semiconductor integrated circuit devices, dimensions of semiconductor elements such as transistors have been reduced. Therefore, not only lateral dimensions of semiconductor elements (dimensions in an in-plane direction of a substrate) such as the gate length of transistors but also longitudinal dimensions thereof such as the thickness of a gate insulating film have been reduced. A silicon oxide film ($SiO_2$ film) has been widely used as a gate insulating film due to its affinity to a semiconductor substrate made of silicon and its insulation performance. However, the relative dielectric constant of $SiO_2$ is only 3.9, and significant reduction in physical film thickness has been demanded in order to increase the capacitance. An ultrathin $SiO_2$ film of less than 2 nm thickness has therefore been used in recent years. In the case where a $SiO_2$ film of less than 2 nm thickness is used, however, a direct tunneling current flows instead of a Fowler-Nordheim tunneling current. This increases a leakage current, making it difficult to suppress power consumption not only during operation of a device but also in a stand-by state.

A silicon oxynitride film (SiON film) has therefore been increasingly used to avoid this problem. The silicon oxynitride film is a $SiO_2$ film having nitrogen introduced therein in order to increase the relative dielectric constant to about 5, that is, an intermediate value between the relative dielectric constant (7) of a $Si_3N_4$ film and the relative dielectric constant (3.9) of a $SiO_2$ film. However, the relative dielectric constant value increases by only 25% and the leakage current decreases by only one digit or less. It is therefore extremely difficult to implement an EOT (Equivalent Oxide Thickness) of 1.5 nm or less even when a SiON film is used as a gate insulating film.

It has been considered to use a high dielectric constant metal oxide film or a high dielectric constant metal silicate film having a high relative dielectric constant as a gate insulating film. Especially, a hafnium oxide ($HfO_x$) film or a hafnium silicate (HfSiO) film has drawn attention because a relative dielectric constant of 25 or 14 to 18 is obtained.

FIG. 12A shows a relation between the EOT and the leakage current of a $SiO_2$ film, a SiON film, and so-called High-K insulating films such as a high dielectric constant metal oxide film and a high dielectric constant metal silicate film. It can be seen from FIG. 12A that the High-K insulating films capable of suppressing the leakage current by several digits as compared to the $SiO_2$ film and the SiON film are promising as a next-generation ultrathin gate insulating film. However, further reduction in leakage current has been demanded for the High-K films as well. A $HfO_x$ film and a HfSiO film can be deposited by a known MOCVD (Metal-Organic Chemical Vapor Deposition) method. However, since a thin thickness of 1 nm to 2 nm has been demanded for such a high dielectric constant metal oxide film and a high dielectric constant metal silicate film as well, it has becoming common to use an ALD (Atomic Layer Deposition) method in addition to a conventionally used MOCVD method. FIG. 12B shows a gate structure of a conventional transistor having a high dielectric constant metal silicate film as a gate insulating film. In this transistor, an interface layer 102, a gate insulating film 103, and a gate electrode 104 are sequentially formed on a semiconductor substrate 101. For example, the semiconductor substrate 101 is made of silicon, the interface layer 102 is made of $SiO_2$ or the like, the gate insulating film 103 is made of a high dielectric constant metal silicate, and the gate electrode 104 are made of a polycrystalline silicon, a metal, or the like.

As shown in FIG. 13A, in a conventional ALD method, a metal film corresponding to one layer is formed by performing the following steps as a cycle: the steps of exposing a semiconductor substrate to a precursor (Hf) of a metal of a high dielectric constant metal oxide film for a predetermined time, purging the precursor, exposing the semiconductor substrate to an oxidizing agent ($O_3$) for a predetermined time, and purging the oxidizing agent. A desired film thickness is obtained by repeating this cycle a plurality of times.

A so-called Nano-laminate method is used when a gate insulating film is made of multiternary compounds, for example, when a gate insulating film is made of a high dielectric constant metal silicate film. In this method, after a high dielectric constant metal oxide film is deposited in a predetermined cycle, a silicon oxide film corresponding to one layer is formed by performing the following steps as a cycle: the steps of exposing a substrate to a precursor (Si) for a predetermined time, purging the precursor, exposing the substrate to an oxidizing agent for a predetermined time, and purging the oxidizing agent. A high dielectric constant metal oxide film and a silicon oxide film are thus alternately deposited, and this alternate formation of the high dielectric constant metal oxide film and the silicon oxide film is repeated until a desired film thickness is obtained.

In a high dielectric constant metal silicate of a gate insulating film, the composition ratio of a high dielectric constant metal to silicon is important because the composition ratio determines the relative dielectric constant, EOT, and leakage current of the high dielectric constant metal silicate. The composition ratio is determined by adjusting the number of deposition cycles of the high dielectric constant metal oxide film and the number of deposition cycles of the silicon oxide film. For example, in a high dielectric constant metal oxide film, as shown in FIG. 13B, the composition ratio of Hf to Si becomes 1:1 (Hf=50%) when a cycle of a $HfO_x$ film and a cycle of a $SiO_2$ film are alternately repeated a plurality of times. As shown in FIG. 13B, the composition ratio of Hf to Si becomes 2:1 (Hf=66.7%) when two cycles of a $HfO_x$ film and a cycle of a $SiO_2$ film are alternately repeated a plurality of times. In this way, the composition of the high dielectric constant metal silicate can be adjusted. The composition ratio of a metal to Si is thus strictly controlled in the ALD method.

It has been pointed out that the ALD method has poor productivity because a metal layer and an oxygen layer are formed on a layer-by-layer basis on an atomic layer level. It has therefore been demanded to minimize the exposure time to a precursor of each material, the purge time of the precursor, and the exposure time to an oxidizing agent. It has been considered that, in the ALD method, deposition of an atomic layer is caused by adsorption of atoms to the surface of a processed film. The ALD method is based on a mechanism in which deposition stops when atoms corresponding to one layer have been completely adsorbed by the surface of a processed film. Accordingly, when the exposure time to a precursor and the exposure time to an oxidizing agent are varied, these exposure times are determined by the saturation time of the film thickness of one layer to be deposited in a cycle.

Of course, the minimum saturation time of the thickness of a deposited film is selected, and the exposure time to a precursor and the exposure time to an oxidizing agent are set so as to maximize the film thickness of a layer to be deposited per cycle. These exposure times therefore tend to be short. For example, Japanese National Phase PCT Laid-Open Patent Publication No. 2007-519225 discloses that the exposure time to a precursor is 0.2 seconds to 0.5 seconds and the exposure time to an oxidizing agent is 2 seconds in an ALD cycle.

Japanese National Phase PCT Laid-Open Patent Publication No. 2004-511909 discloses that the exposure time to a precursor is 1.5 seconds and the exposure time to an oxidizing agent is 3 seconds. The exposure time to a precursor is set to various values depending on the type of the precursor, whereas the exposure time to an oxidizing agent is set approximately to 1 second to 3 seconds.

SUMMARY OF THE INVENTION

In the conventional ALD method, however, the exposure time to a material gas and the exposure time to an oxidizing agent during deposition are determined by the productivity and the ALD deposition theory, and are not determined by the capability of a high dielectric constant metal oxide film or silicate film deposited by the ALD method. In other words, the exposure time to a material gas and the exposure time to an oxidizing agent are not determined by the relative dielectric constant, EOT, leakage current, and the like of a high dielectric constant metal oxide film or silicate film.

According to an ideal ALD method, atoms of a material corresponding to one layer are supposed to be uniformly adsorbed by a semiconductor surface if the exposure time to a material gas is increased infinitely. The film thickness is therefore supposed to be saturated at the time the atoms corresponding to one layer are uniformly adsorbed. Based on this theory, the exposure time to a material is set to the saturation time of the film thickness of a layer that is deposited in a cycle. However, a material is not adsorbed by 100% of the surface of a semiconductor substrate within a fixed time, and the adsorption amount within a fixed time is 80% to 90%. Even if the material is adsorbed by 80% to 90% of the substrate surface in a short time, the subsequent adsorption may take a very long time.

In such a case, in the ALD method, adsorption of a material tends to be saturated at 80% to 90% adsorption. Therefore, the exposure time for deposition is determined based on the exposure time corresponding to this saturation time. Such a method to obtain the exposure time does not have a significant problem for a material gas because the material gas itself causes an adsorption reaction and does not cause a chemical reaction. Accordingly, there is no problem to determine the exposure time to a precursor as a material based on the saturation time of the thickness of a deposited film.

The purge time of the material gas, that is, the time required to replace the material gas, can be easily obtained although it varies depending on the vacuum performance of a device.

It is not easy to determine the exposure time to an oxidizing agent. According to the ALD theory, an oxidizing agent is adsorbed by the surface of a precursor adsorbed on a processed film, and reacts with the precursor to form a high dielectric constant metal oxide or silicon oxide. In this case as well, the oxidizing agent can be adsorbed by and reacted with the entire precursor if the exposure time to the oxidizing agent is increased infinitely. In fact, however, about 90% of adsorption occurs in a short time and the subsequent adsorption reaction proceeds very slowly. In this case, oxygen bonds with only 90% of the precursor and the remaining 10% of the precursor has oxygen deficiency. In other words, even if the precursor is not absorbed by 100% of the substrate surface, it affects only the deposition rate. However, if the oxidizing agent is not adsorbed or reacted by 100% of the precursor, the non-adsorbed portion of the precursor has oxygen deficiency. This oxygen deficiency also causes reduction in relative dielectric constant, increase in EOT, and increase in leakage current of a high dielectric constant metal oxide film or a high dielectric constant metal silicate film. Increase in leakage current is especially sensitive to the oxygen deficiency.

FIG. 14A shows a relation between the composition ratio of oxygen (O) to hafnium (Hf) (O/Hf ratio) and the leakage current and the relative dielectric constant of a $HfO_x$ film. The $HfO_x$ film has a stoichiometric composition ratio of 2.0. As can be seen from FIG. 14A, the leakage current is stable in a region where the O/Hf ratio is 1.93 (96.5% of the stoichiometric value) or higher, but increases rapidly in a region where the O/Hf ratio is less than 1.93. Increase in oxygen deficiency causes increase in leakage current because the oxygen deficient portion serves as a leakage path. The relative dielectric constant is approximately saturated and stable at about 25 in the region where the O/Hf ratio is 1.93 or higher. However, the relative dielectric constant decreases rapidly in the region where the O/Hf ratio is less than 1.93. The $HfO_x$ film has a high dielectric constant as a high dielectric constant metal oxide when hafnium (Hf) and oxygen (O) bond with each other correctly. It is considered that when there is a large amount of oxygen deficiency, metallic bonds such as Hf—Hf increase, thereby decreasing the relative dielectric constant and increasing the leakage current because these metallic bonds serve as a leakage path. Note that the data was obtained with the same physical film thickness, and cannot be explained by the difference in physical film thickness.

FIG. 14B shows a plot of a relation between the EOT and the leakage current of a $HfO_x$ film regarding the O/Hf ratios. As can be seen from FIG. 14B, since the physical film thickness decreases with decrease in EOT, the leakage current increases rapidly near EOT=1.2 nm. When the O/Hf ratio is 2.0 which is a stoichiometric value of the $HfO_x$ film, the leakage current increases rapidly when the EOT is 1.2 nm or less. The leakage current gradually increases when the O/Hf ratio is 1.91 (95.5%) and 1.89 (94.5%). The leakage current is degraded by about two digits when the O/Hf ratio is 1.87 (93.5%). The plotted data group of the EOT is shifted toward the thicker side with decrease in O/Hf ratio. Even with the same physical film thickness, the EOT increases and the leakage current increases significantly with decrease in O/Hf ratio due to decrease in relative dielectric constant.

The knowledge of the inventors of the present application about a high dielectric constant metal oxide film, a $HfO_x$ film, has been described above. As described above, in the Nanolaminate method, a high dielectric constant metal silicate film is a layered structure of a $HfO_x$ film and a $SiO_x$ film. It can therefore easily be inferred that a large amount of oxygen deficiency in the $HfO_x$ film or the $SiO_x$ film will cause reduction in relative dielectric constant and increase in EOT and thus cause increase in leakage current in the high dielectric constant metal silicate film. When a high dielectric constant metal oxide film or a high dielectric constant metal silicate film is formed by the ALD method, reducing oxygen deficiency is therefore very important to improve the capability of the high dielectric constant metal oxide film or the high dielectric constant metal silicate film.

The present invention is made to solve the above problems and it is an object of the present invention to enable reduction in leakage current by reducing oxygen deficiency in a high dielectric constant metal oxide film or a high dielectric constant metal silicate film which is used for a gate insulating film.

In order to achieve the above object, in a method for forming a gate insulating film made of a metal oxide or a metal silicate according to the present invention, not only an adsorption reaction of an oxidizing agent but also an oxidization reaction of the oxidizing agent are actively used to form an oxide film by an ALD method.

More specifically, a first method for forming a gate insulating film according to the present invention is a method for forming a gate insulating film of a high dielectric constant metal silicate on a semiconductor substrate. The method includes the steps of: (a) with the semiconductor substrate being held at 500° C. or less and a predetermined pressure, exposing the semiconductor substrate to a first precursor containing a metal element of the high dielectric constant metal silicate to form a first adsorption layer of the first precursor on the semiconductor substrate; (b) purging the first precursor; (c) exposing the first adsorption layer to an oxidizing agent and thus oxidizing the first adsorption layer to form a metal oxide film from the first adsorption layer; (d) purging the oxidizing agent; (e) after the step (d), exposing the metal oxide film to a second precursor containing silicon to form a second adsorption layer of the second precursor on the metal oxide film; (f) purging the second precursor; (g) exposing the second adsorption layer to the oxidizing agent and thus oxidizing the second adsorption layer to form a silicon oxide film from the second adsorption layer; and (h) purging the oxidizing agent. A cycle comprised of the steps (a), (b), (c), and (d) is performed at least once to form at least one layer of an atomic layer level of the metal oxide film, and a cycle comprised of the steps (e), (f), (g), and (h) is performed at least once to form at least one layer of an atomic layer level of the silicon oxide film, whereby the high dielectric constant metal silicate is formed. In the step (a), exposure time of the semiconductor substrate to the first precursor is determined by saturation time of a thickness of the one layer of the metal oxide film deposited by the cycle. In the step (c), exposure time of the first adsorption layer to the oxidizing agent is determined by time required for an oxygen content in the metal oxide film to reach 97% or more of a composition that is determined by stoichiometry. In the step (e), exposure time of the metal oxide film to the second precursor is determined by saturation time of a thickness of the one layer of the silicon oxide film deposited in the cycle. In the step (g), exposure time of the second adsorption layer to the oxidizing agent is determined by time required for an oxygen content in the silicon oxide film to reach 97% or more of a composition that is determined by stoichiometry.

In the first method for forming a gate insulating film, the exposure time to the oxidizing agent in each of the steps (c) and (g) is preferably 5 seconds or more per semiconductor substrate, and is preferably set to either the exposure time in the step (c) or the exposure time in the step (g) which has a longer duration of the step.

A second method for forming a gate insulating film according to the present invention is a method for forming a gate insulating film of a high dielectric constant metal oxide on a semiconductor substrate. The method includes the steps of: (a) with the semiconductor substrate being held at 500° C. or less and a predetermined pressure, exposing the semiconductor substrate to a precursor containing a metal element of the high dielectric constant metal oxide to form an adsorption layer of the precursor on the semiconductor substrate; (b) purging the precursor; (c) exposing the adsorption layer to an oxidizing agent and thus oxidizing the adsorption layer to form a metal oxide film from the adsorption layer; and (d) purging the oxidizing agent. A cycle comprised of the steps (a), (b), (c), and (d) is performed at least once to form at least one layer of an atomic layer level of the metal oxide film, whereby the high dielectric constant metal oxide is formed. In the step (a), exposure time of the semiconductor substrate to the precursor is determined by saturation time of a thickness of the one layer of the metal oxide film deposited by the cycle. In the step (c), exposure time of the adsorption layer to the oxidizing agent is determined by time required for an oxygen content in the metal oxide film to reach 97% or more of a composition that is determined by stoichiometry.

In the second method for forming a gate insulating film, the metal oxide film is preferably made of a hafnium oxide or a zirconium oxide.

In the second method for forming a gate insulating film, the precursor is preferably hafnium tetrachloride ($HfCl_4$), tetrakis-ethyl-methyl-amino-hafnium (TEMAH), or tetrakis-di-methyl-amino-hafnium (TDMAH).

A third method for forming a gate insulating film according to the present invention is a method for forming a gate insulating film of a high dielectric constant metal silicate on a semiconductor substrate. The method includes the steps of: (a) with the semiconductor substrate being held at 500° C. or less and a predetermined pressure, exposing the semiconductor substrate to a first precursor containing a metal element of the high dielectric constant metal silicate and a second precursor containing silicon of the high dielectric constant metal silicate at a mixing ratio corresponding to a composition ratio of the high dielectric constant metal silicate, thereby forming on the semiconductor substrate an adsorption layer made of the first precursor and the second precursor and having a composition ratio corresponding to the composition ratio of the high dielectric constant metal silicate; (b) purging the first precursor and the second precursor; (c) exposing the adsorption layer to an oxidizing agent and thus oxidizing the adsorption layer to form a metal silicate film from the adsorption layer; and (d) purging the oxidizing agent. A cycle comprised of the steps (a), (b), and (c) is performed at least once to form at least one layer of an atomic layer level of the metal silicate film, whereby the high dielectric constant metal silicate is formed. In the step (a), exposure time of the semiconductor substrate to the first precursor and the second precursor is set to a longer one of respective saturation times of a thickness of the one layer deposited by the cycle which are obtained when an oxide film of a metal of the high dielectric constant metal silicate and an oxide film of silicon of the high dielectric constant metal silicate are independently deposited. In the step (c), exposure time of the adsorption layer to the oxidizing agent is set to a longer one of respective times required for an oxygen content in the oxide film of the metal and an oxygen content in the oxide film of silicon to reach 97% or more of a composition that is determined by stoichiometry when the oxide film of the metal of the high dielectric constant metal silicate and the oxide film of silicon of the high dielectric constant metal silicate are independently deposited.

In the first or third method for forming a gate insulating film of the present invention, the high dielectric constant metal silicate is preferably a hafnium silicate (HfSiO) or a hafnium lanthanum silicate (HfLaSiO).

In the first through third methods for forming a gate insulating film of the present invention, the oxidizing agent is preferably ozone ($O_3$), water vapor ($H_2O$), heavy water ($D_2O$), or dinitrogen monoxide ($N_2O$), or an oxygen radical.

In the first or third method for forming a gate insulating film of the present invention, the first precursor is preferably hafnium tetrachloride ($HfCl_4$), tetrakis-ethyl-methyl-amino-hafnium (TEMAH), or tetrakis-di-methyl-amino-hafnium (TDMAH), and the second precursor is preferably silicon tetrachloride ($SiCl_4$), tris-di-methyl-amino-silicon (TDMAS), or tetraethyl orthosilicate (TEOS).

In the third method for forming a gate insulating film of the present invention, the first precursor and the second precursor preferably contain oxygen.

In the first through third methods for forming a gate insulating film of the present invention, in the step of exposing to the oxidizing agent, a heating temperature of the semiconductor substrate is preferably a temperature of an atomic layer deposition (ALD) reaction or up to a temperature at which a reaction mode transitions from the atomic layer deposition (ALD) reaction to a chemical vapor deposition (CVD) reaction, and the predetermined pressure is preferably a pressure up to right before in-plane uniformity of the semiconductor substrate is degraded.

In the first through third methods for forming a gate insulating film of the present invention, in the step of exposing to the oxidizing agent, a heating temperature of the semiconductor substrate is preferably 300° C. or higher and is such a temperature that a chemical vapor deposition (CVD) reaction does not become dominant, and the predetermined pressure is preferably $1.33 \times 10^2$ Pa to $3.99 \times 10^2$ Pa.

As has been described above, when a gate insulating film made of a high dielectric constant metal silicate or a high dielectric constant metal oxide is formed by the method for forming a gate insulating film of the present invention, the exposure time to a metal precursor or a silicon precursor can be determined based on the saturation time of the deposition rate, whereby productivity can be maximized. Moreover, not only the exposure time to the oxidizing agent which determines the film quality of the gate insulating film such as an EOT, a dielectric constant, and a leakage current is set to a value capable of implementing a stoichiometric value of the high dielectric constant metal oxide or the high dielectric constant silicon oxide, but also the deposition temperature and the deposition pressure are set so as to maximize the oxidation reaction in the step of exposing to the oxidizing agent. As a result, a gate insulating film capable of implementing both high productivity and a high film quality can be obtained.

Note that the method for forming a gate insulating film of the present invention can be applied to both single-wafer processing and batch processing.

The method for forming a gate insulating film of the present invention can implement an excellent film quality with small oxygen deficiency and low leakage current when the gate insulating film made of a high dielectric constant metal silicate or a high dielectric constant metal oxide is formed.

BRIEF DESCRIPTION OF THE DRAWINGS

FIGS. 10A and 10B are schematic diagrams showing a deposition model of a high dielectric constant metal silicate (HfSiO) film and sequentially illustrating the steps of the method for forming a gate insulating film according to the second example embodiment;

FIG. 11 is a graph showing a relation between the EOT and the leakage current of a high dielectric constant metal silicate (HfSiO) film in the first example embodiment, the second example embodiment, and a conventional example;

FIGS. 14A and 14B are graphs illustrating problems to be solved by the present invention, wherein FIG. 14A is a graph showing oxygen-composition-ratio (O/Hf ratio) dependency of the relative dielectric constant and the leakage current of a HfO$_x$ film, and FIG. 14B is a graph showing EOT dependency and oxygen-composition-ratio (O/Hf ratio) dependency of the leakage current.

DETAILED DESCRIPTION OF THE PREFERRED EMBODIMENTS

First Example Embodiment

A first example embodiment will now be described with reference to the figures.

FIGS. 1A through 1D show cross-sectional structures sequentially illustrating the steps of a method for forming a gate insulating film according to the first example embodiment.

Figure 1A:
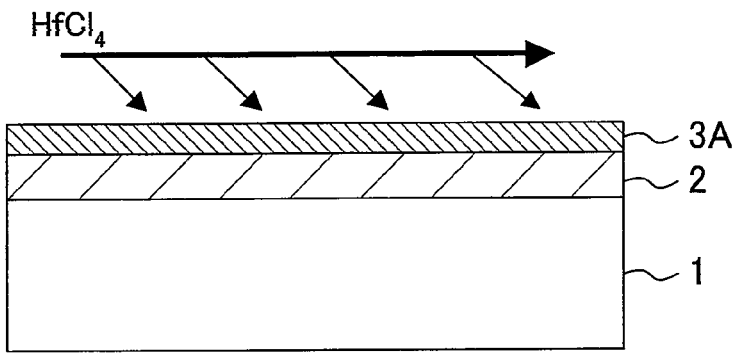
FIGS. 1A, 1B, 1C, and 1D are schematic cross-sectional views sequentially illustrating the steps of a method for forming a gate insulating film according to a first example embodiment.

First, as shown in FIG. 1A, an interface layer 2 is formed on a main surface of a semiconductor substrate 1 before a high dielectric constant metal silicate film is formed. More specifically, the interface layer 2 is formed on an active region where a gate insulating film is to be formed. The semiconductor substrate 1 is made of silicon and the interface layer 2 is made of silicon oxide (SiO$_2$). The interface layer 2 is formed between the gate insulating film made of a high dielectric constant metal silicate and the semiconductor substrate 1. The interface between the semiconductor substrate 1 and the high dielectric constant metal silicate film is thus made of silicon oxide (SiO$_2$), whereby interface characteristics of the semiconductor substrate 1 are improved. It is possible to form the high dielectric constant metal silicate film directly on the main surface of the semiconductor substrate 1. In this example embodiment, however, the high dielectric constant metal silicate film is formed on the interface layer 1. The interface layer 2 is formed with a thickness of 1.4 nm by applying lamp light to the semiconductor substrate 1 in, for example, a reduced-pressure atmosphere containing 1% of hydrogen and 99% of oxygen at 900° C. In order to improve the relative dielectric constant of the interface layer 2 and to prevent oxygen diffusion into the semiconductor substrate 1, the surface of the interface layer 2 is then nitrided by exposing the interface layer 2 to a high density nitrogen plasma having low electron energy of 1 eV or less. The interface layer 2 is now made of silicon oxynitride (SiON). In order to eliminate unbound nitrogen from the nitrided surface of the interface layer 2 and to improve interface characteristics between the semiconductor substrate 1 of Si and the interface layer 2 of SiON, an annealing process is then performed in an oxygen (O$_2$) atmosphere with 0.66×10$^2$ Pa (=0.5 Torr) at 1,050° C. for 30 seconds.

Thereafter, with the semiconductor substrate 1 placed in, for example, a single-wafer chamber having a shower head in a gas introducing portion, a hafnium silicate (HfSiO) film is deposited as a high dielectric constant metal silicate as shown in FIGS. 1A through 1D. At this time, the temperature of the semiconductor substrate 1 is held at 350° C. and the pressure in the single-wafer chamber is held at 2.66×10$^2$ Pa (=2 Torr)

More specifically, as shown in FIG. 1A, in order to form a hafnium oxide (HfO$_x$) film, hafnium tetrachloride (HfCl$_4$) is first introduced into the chamber as a Hf precursor. The interface layer 2 is then exposed to HfCl$_4$ for 1.5 seconds to form a Hf adsorption layer 3A on the interface layer 2. HfCl$_4$ is then purged with nitrogen (N$_2$) for 2 seconds.

Figure 1B:
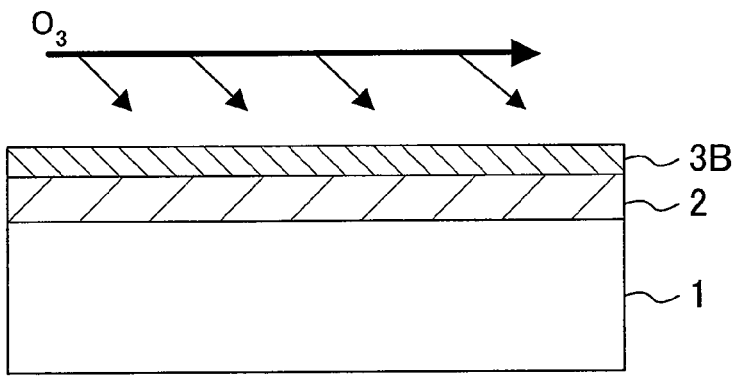

As shown in FIG. 1B, the Hf adsorption layer 3A is then exposed to an ozone (O$_3$) gas having a concentration of 20% as an oxidizing agent for 6 seconds to reform the Hf adsorption layer 3A to a hafnium oxide (HfO$_2$) film 3B. O$_3$ is then purged with nitrogen for 2 seconds.

Figure 1C:
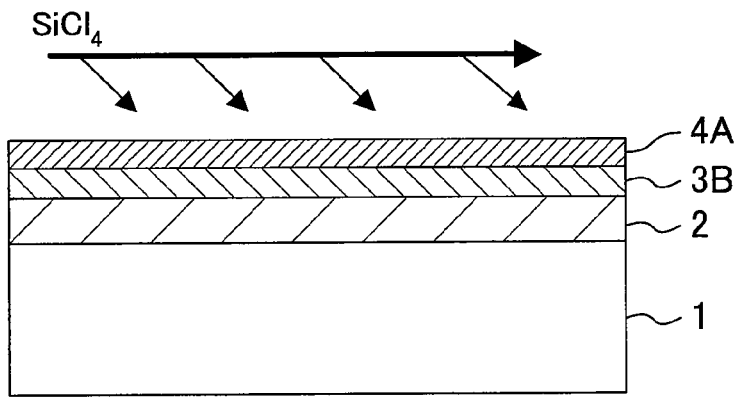

As shown in FIG. 1C, silicon tetrachloride (SiCl$_4$) is then introduced into the chamber as a Si precursor. The HfO$_2$ film 3B is then exposed to SiCl$_4$ for 0.2 seconds to form a Si adsorption layer 4A on the HfO$_2$ film 3B. SiCl$_4$ is then purged with nitrogen for 6 seconds.

Figure 1D:
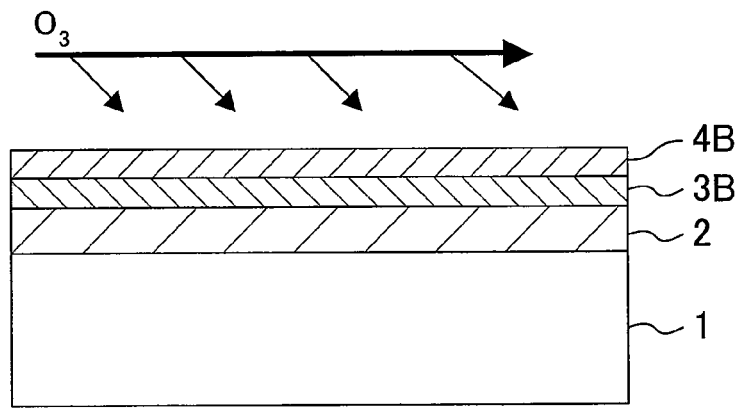

As shown in FIG. 1D, the Si adsorption layer 4A is then exposed to an ozone (O$_3$) gas having a concentration of 20% as an oxidizing agent for 6 seconds to reform the Si adsorption layer 4A to a silicon oxide (SiO$_2$) film 4B. O$_3$ is then purged with nitrogen for 6 seconds.

A hafnium silicate (HfSiO) film having a thickness of 2.6 nm is deposited by performing a cycle of the four steps of FIGS. 1A through 1D ten times. Provided that a cycle of the HfO$_x$ film shown in FIGS. 1A and 1B and a cycle of the SiO$_x$ film shown in FIGS. 1C and 1D are together regarded as one cycle, the film deposition rate per cycle is 0.26 nm/cycle.

Figure 2:
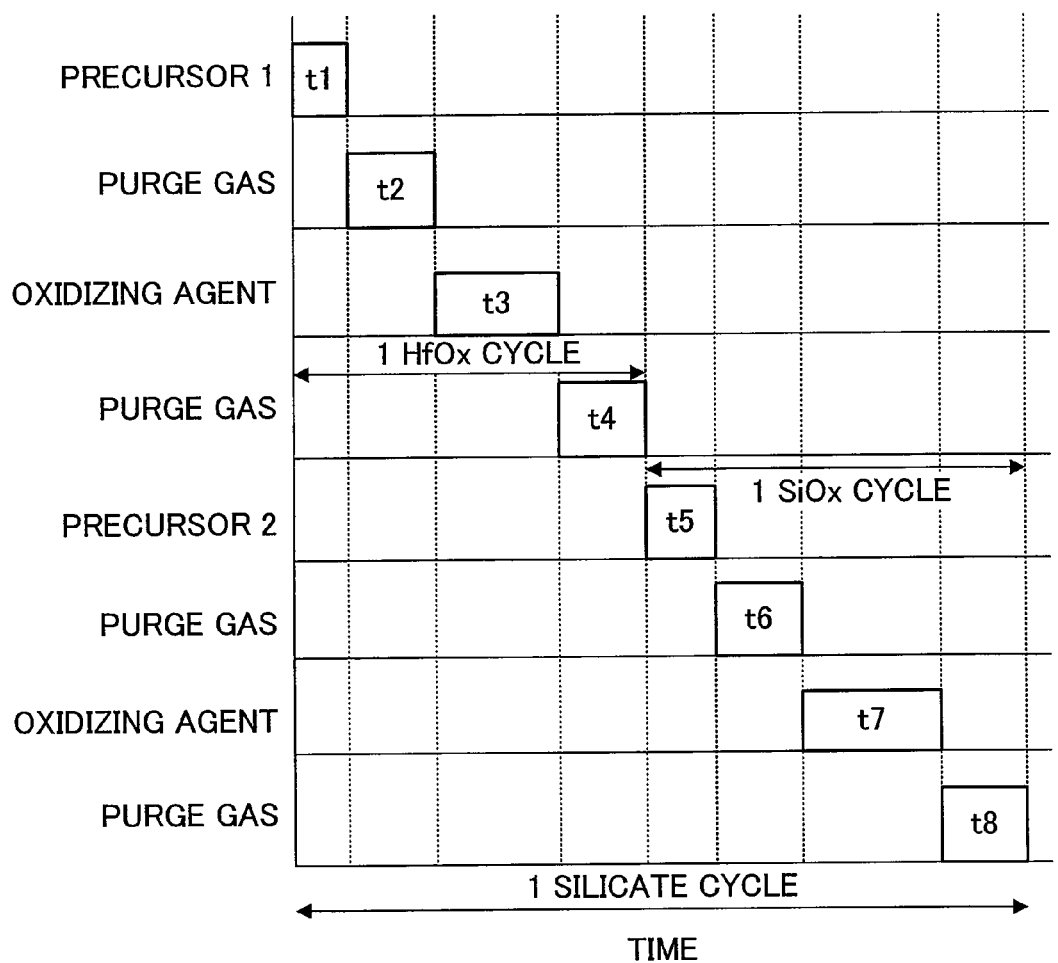
FIG. 2 is a gas sequence diagram in the method for forming a gate insulating film according to the first example embodiment.

FIG. 2 shows a gas introducing sequence in the method for forming a gate insulating film according to the first example embodiment. A precursor 1 is HfCl$_4$ and exposure time t1 to HfCl$_4$ is 1.5 seconds. An oxidizing agent is ozone and exposure time t3 to ozone is 6 seconds. Respective purge times t2 and t4 of HfCl$_4$ and ozone are set to 2 seconds. A precursor 2 is SiCl$_4$ and exposure time t5 to SiCl$_4$ is 0.2 seconds. An oxidizing agent is ozone and exposure time t7 to ozone is 6 seconds. Respective purge times t6 and t8 of SiCl$_4$ and ozone are 6 seconds. Accordingly, the time required for a cycle of forming the HfSiO film is 29.7 seconds. In other words, the processing time of about 300 seconds is required for 10 cycles.

Figure 3A:
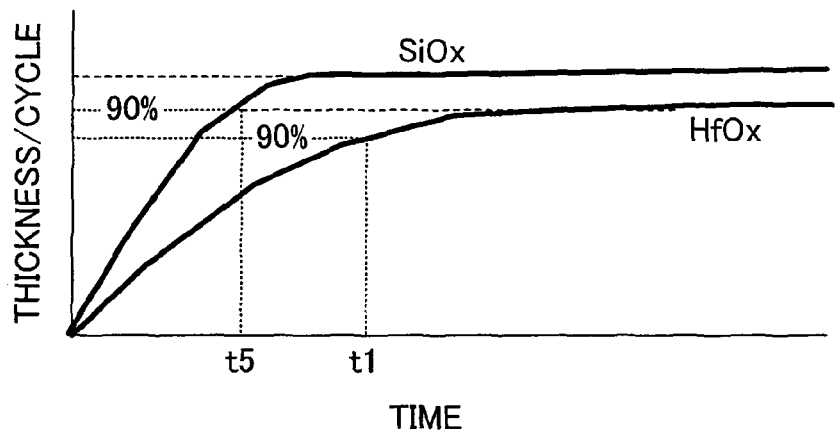
FIG. 3A is a graph showing a method for determining respective exposure times to a Hf precursor and a Si precursor in the method for forming a gate insulating film according to the first example embodiment.

As shown in FIG. 3A, provided that the exposure time to ozone is constant, the respective exposure times to the Hf precursor and the Si precursor are determined as the saturation time of the film thickness in a cycle in the first example embodiment. As a result, t1 is set to 1.5 seconds when the Hf precursor is HfCl$_4$, and t5 is set to 0.2 seconds when the Si precursor is SiCl$_4$. The exposure time to a precursor of course varies depending on the composition of the precursor. For example, when tetrakis-ethyl-methyl-amino-hafnium (TEMAH) is used as the Hf precursor, the exposure time to TEMAH can be 1 second.

Note that there is no significant problem even when the respective exposure times to the Hf precursor and the Si precursor are shorter than that obtained above. In this case, the film deposition rate is reduced and productivity of a gate insulating film is therefore reduced. However, the film deposition rate per cycle should be adjusted by the exposure time of the precursor in order to form a thin film such as a gate insulating film.

Figure 3B:
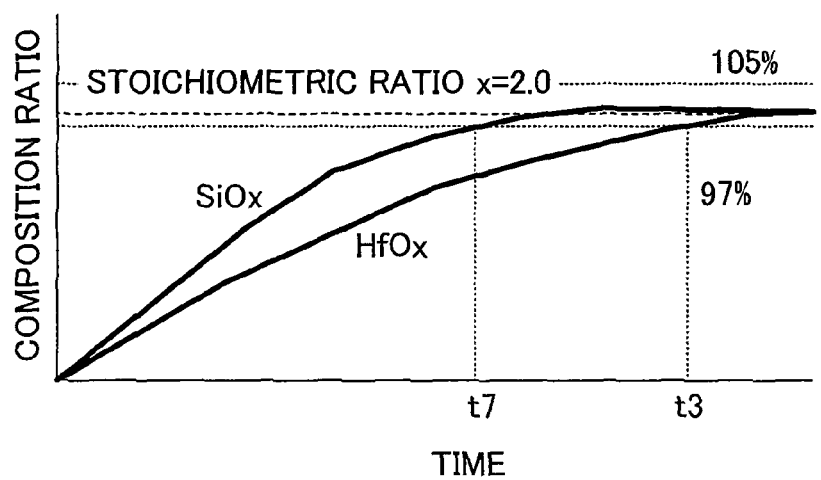
FIG. 3B is a graph showing a method for determining exposure time to an oxidizing agent in the method for forming a gate insulating film according to the first example embodiment.

In the first example embodiment, ozone is used as an oxidizing agent. FIG. 3B conceptually shows the exposure time to the oxidizing agent for forming the HfO$_x$ film or the SiO$_x$ film having a stoichiometric composition. It is herein assumed that the exposure time to the Hf precursor or the Si precursor is constant. The exposure time to the oxidizing agent in the first example embodiment is determined based on FIG. 3B. Although a stoichiometric value x is 2 in both HfO$_x$ and SiO$_x$, the exposure time to the oxidizing agent for providing that stoichiometric value may be different from each other.

In the first example embodiment, in the case of HfO$_x$, exposure time t3 that provides an O/Hf ratio exceeding a stoichiometric value of 1.94 (97%) is 6 seconds. In the case of SiO$_x$, exposure time t7 that provides an O/Si ratio exceeding a stoichiometric value of 1.94 (97%) is 5 seconds. Since the exposure time to $HfO_x$ and the exposure time to $SiO_x$ are close to each other, the exposure time to $HfO_x$ is herein used as the exposure time to the oxidizing agent. In other words, the exposure time to the oxidizing agent is herein set to 6 seconds. Although the exposure time to the oxidizing agent is affected by the exposure time to the Hf precursor or the Si precursor, the influence is not so great. Although the exposure time to the oxidizing agent of course increases with increase in exposure time to the Hf precursor or the Si precursor, the influence is gentle. In any case, the exposure time to the oxidizing agent should be determined after the exposure time to the Hf precursor or the Si precursor is determined.

Note that although ozone ($O_3$) is herein used as the oxidizing agent, water ($H_2O$) or heavy water ($D_2O$) may be used instead of ozone. However, since water is different in reactivity and adsorption characteristics from ozone, the exposure time that provides a stoichiometric value is different from that for ozone. Since ozone has higher reactivity than that of water, the exposure time to ozone is generally short. The exposure time to ozone tends to be reduced with increase in ozone concentration.

Figure 4:
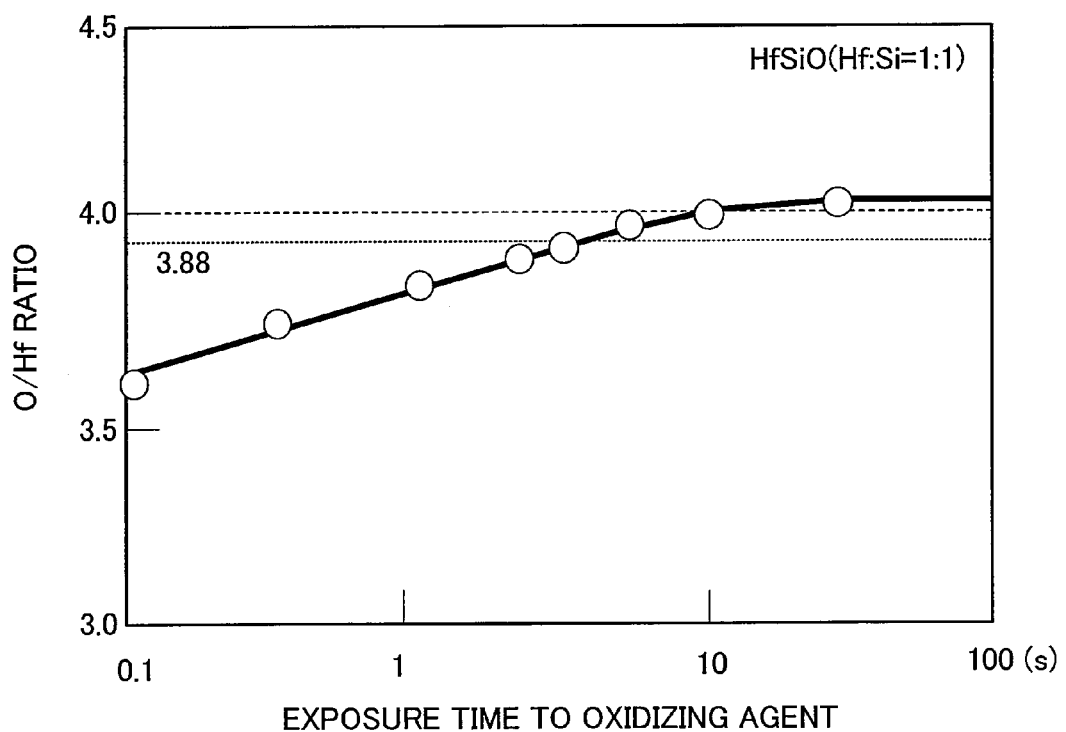
FIG. 4 is a graph showing a relation between the exposure time to an oxidizing agent and the stoichiometric composition ratio of oxygen (O) to hafnium (Hf) in the method for forming a gate insulating film according to the first example embodiment.

FIG. 4 shows a relation between the exposure time to ozone as an oxidizing agent and the composition ratio of O to Hf in a hafnium silicate (HfSiO) film formed by the method for forming a gate insulating film according to the first example embodiment. In this HfSiO film, the composition ratio of Hf to Si is 1:1 (Hf=50%). Since the composition ratio of Hf to Si is herein 1:1, hafnium silicate is stoichiometrically $HfSiO_4$. The stoichiometric composition of O with respect to Hf is 4.0 when Si is taken into consideration. Since this film is actually a $HfO_x$ film, x=2. Since the respective compositions of oxygen (O) with respect to Hf and Si cannot be measured due to the limitation of analysis technology, the composition ratio of O to Hf was measured by an electron probe microanalysis (EPMA) method after it was confirmed that the composition ratio of Hf to Si was 1:1. Note that this composition ration may alternatively be measured by an X-ray photoelectron spectroscopy (XPS) method.

As shown in FIG. 4, when the exposure time to the oxidizing agent (ozone) is varied from 0.1 seconds to several tens of seconds, the composition ratio of O to Hf increases and becomes approximately close to a stoichiometric value after 5 seconds or more. The composition ratio of O to Hf exceeds the stoichiometric value when the exposure time is extended. This is because there is excessive oxygen that does not necessarily bond with Hf or Si. The composition ratio of O to Hf exceeding the stoichiometric value can therefore be regarded as the stoichiometric value.

Figure 5A:
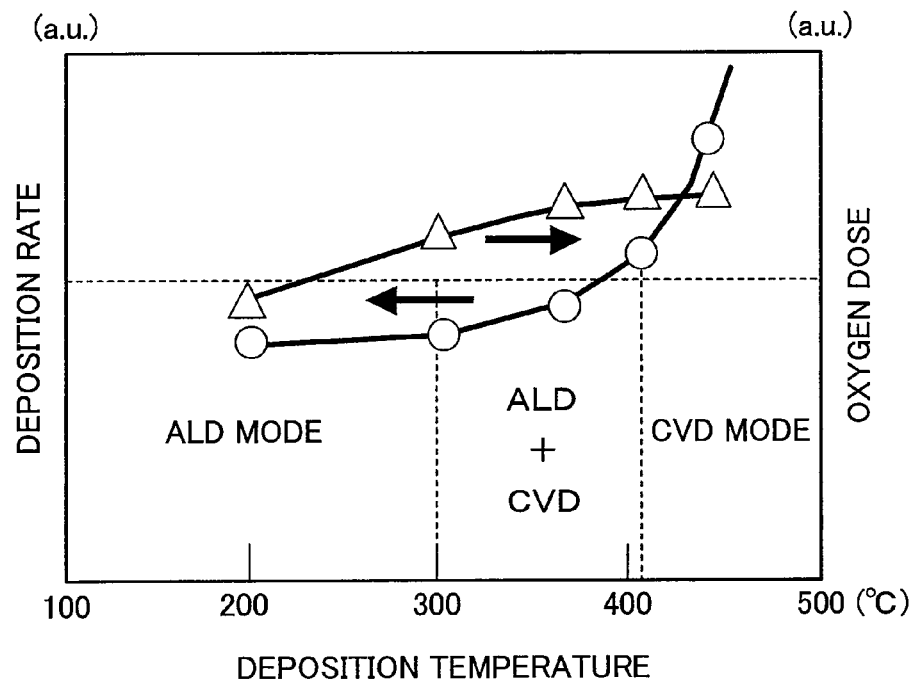
FIG. 5A is a graph showing deposition temperature dependency of the deposition rate and the oxygen dose in the method for forming a gate insulating film according to the first example embodiment.

FIG. 5A shows deposition temperature dependency of the deposition rate and the oxygen dose per cycle. In the case of ALD mode deposition having an ideal adsorption reaction, the deposition rate and the oxygen dose are not supposed to depend on the deposition temperature. When the deposition temperature becomes higher, however, CVD mode deposition causing a chemical reaction actually starts and the deposition rate therefore increases rapidly. When the deposition temperature is a certain value or less, on the other hand, the deposition rate is approximately constant, although not completely constant. The oxygen dose increases with increase in temperature. This indicates that the reaction by the oxidizing agent depends not only on an adsorption reaction but also on a chemical reaction that occurs after adsorption.

Figure 5B:
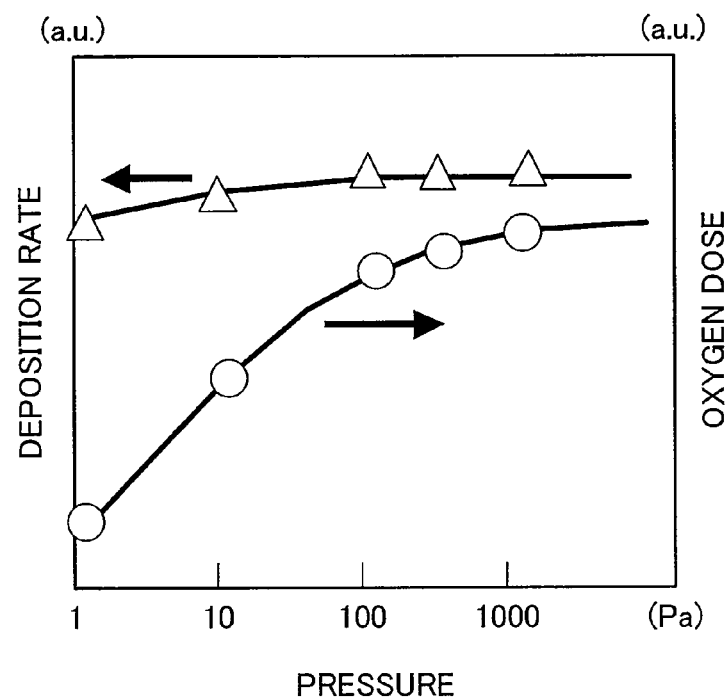
FIG. 5B is a graph showing deposition pressure dependency of the deposition rate and the oxygen dose in the method for forming a gate insulating film according to the first example embodiment.

FIG. 5B shows pressure dependency of the deposition rate and the oxygen dose per cycle. Although the deposition rate hardly depends on the pressure, the oxygen dose greatly depends on the pressure. This is because the deposition rate is mostly governed by adsorption of a precursor such as Hf or Si and the oxygen dose is governed by adsorption and reaction of the oxidizing agent.

In other words, in the conventional ALD method, a high dielectric constant metal silicate film is formed by using an adsorption reaction of a metal precursor, a silicon precursor, and an oxidizing agent. The inventors of the present application found a method for forming a high dielectric constant metal silicate film having as small oxygen deficiency as that in a CVD method, while retaining the advantages of the conventional ALD method such as film thickness controllability, uniformity, and low temperature reactivity. Such a method for forming a high dielectric constant metal silicate film is achieved by performing exposure to an oxidizing agent under such conditions that can facilitate not only an adsorption reaction but also an oxidation reaction, According to the present invention, the deposition temperature and the deposition pressure are preferably determined so as to maximize the oxidation function of the oxidizing agent. Since the decomposition temperature, that is, the CVD reaction temperature, of a precursor varies depending on the type of the precursor, the deposition temperature is not uniquely determined. However, the deposition temperature is preferably in the range of 320° C. to 380° C. When the deposition temperature is 300° C. or less, the heat assist for the oxidation reaction by the oxidizing agent is small. When the deposition temperature is 380° C. or higher, the CVD reaction of the precursor starts and the reaction of the oxidizing agent is facilitated excessively. As a result, the oxidation reaction may reach a semiconductor substrate, whereby the semiconductor substrate may be oxidized.

In the conventional ALD method, the deposition pressure is often set to the maximum value possible, that is, the limit of the vacuum capability. However, the concentration of the oxidizing agent needs to be increased in order to cause efficient reaction of the oxidizing agent. In the present invention, the deposition pressure is therefore set to $1.33 \times 10^2$ Pa to $3.99 \times 10^2$ Pa (=1 Torr to 3 Torr). When the deposition pressure is less than $1.33 \times 10^2$ Pa, the oxidation function cannot be sufficiently obtained. When the deposition pressure exceeds $3.99 \times 10^2$ Pa, uniformity of the film thickness cannot be sufficiently assured. In other words, the exposure time to the oxidizing agent and the oxidation reaction of the oxidizing agent are very important factors that determine the quality of the hafnium silicate (HfSiO) film. Setting the exposure time to the oxidizing agent stoichiometrically according to the material (precursor) is therefore extremely effective to improve the quality of the HfSiO film.

In the first example embodiment, the $HfO_x$ film is first formed on the interface layer 2 on the semiconductor substrate 1, and the $SiO_x$ film is then formed on the $HfO_x$ film. However, the $SiO_x$ film may be formed first and the $HfO_x$ film may then be formed.

Figure 6:
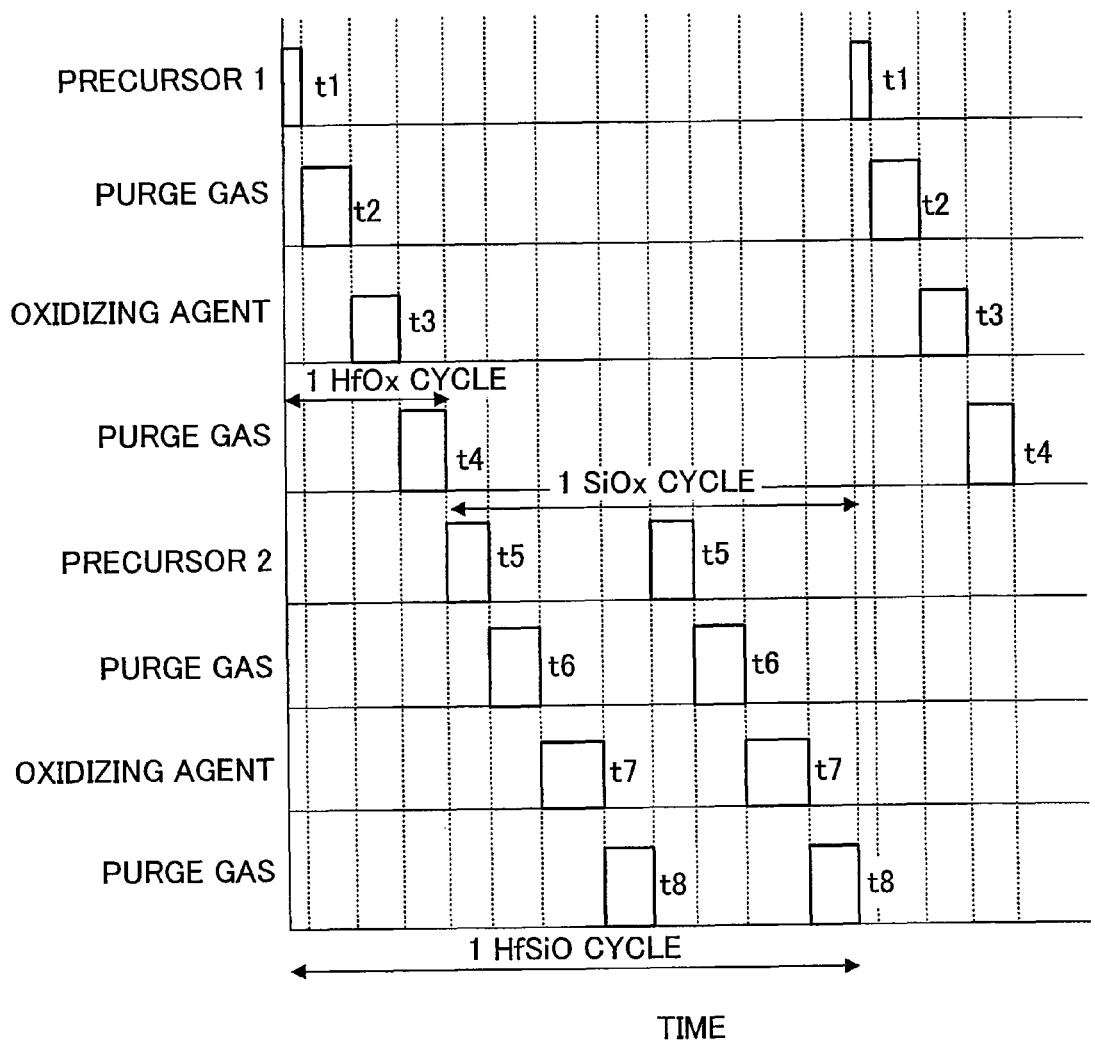
FIG. 6 is a gas sequence diagram in a method for forming a gate insulating film according to a first modification of the first example embodiment.

FIG. 6 shows a gas sequence in a film deposition process as a first modification of the first example embodiment. In this modification, a hafnium silicate (HfSiO) is used as a material of the gate insulating film and the composition ratio of Hs to Si is set to, for example, Hf:Si=1:2 (Hf=33%). As shown in FIG. 6, a cycle of HfSiO is comprised of a cycle of $HfO_x$ and two cycles of $SiO_x$. A cycle of HfSiO is repeated until a desired thickness is obtained.

In a second modification of the first example embodiment, a high dielectric constant metal oxide film such as a hafnium oxide ($HfO_x$) may be used as a material of the gate insulating film instead of a high dielectric constant metal silicate such as a hafnium silicate. In this case, only a cycle of $HfO_x$ shown in FIG. 2 or 6 is repeated until a desired thickness is obtained.

The metal oxide is not limited to a hafnium oxide ($HfO_x$), but a zirconium oxide ($ZrO_x$) may be used.

Second Example Embodiment

Hereinafter, a second example embodiment will be described with reference to the figures.

FIGS. 7A through 7D show cross-sectional structures sequentially illustrating the steps of a method for forming a gate insulating film according to the second example embodiment.

Figure 7A:
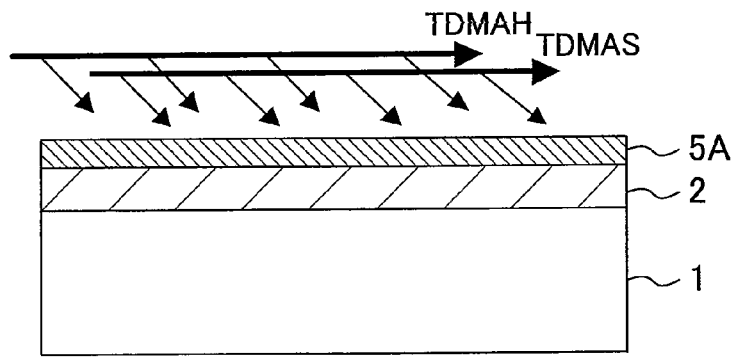
FIGS. 7A, 7B, 7C, and 7D are schematic cross-sectional views sequentially illustrating the steps of a method for forming a gate insulating film according to a second example embodiment.

First, as shown in FIG. 7A, an interface layer 2 is formed on a main surface of a semiconductor substrate 1 in the same manner as that of the first example embodiment. The interface layer 2 is formed on an active region where a gate insulating film is to be formed. The semiconductor substrate 1 is made of silicon and the interface layer 2 is made of $SiO_2$. The surface of the interface layer 2 is then nitride, and the interface layer 2 is thus made of silicon oxynitride (SiON). An annealing process is then performed in an oxygen atmosphere.

The semiconductor substrate 1 is then held in, for example, a single-wafer chamber having a shower head in a gas introducing portion. Tetrakis-di-methyl-amino-hafnium (TDMAH) as a Hf precursor and tris-di-methyl-amino-silicon (TDMAS) as a Si precursor are mixed at a predetermined ratio and the mixture is then introduced into the shower head. The mixture is introduced into the chamber from the shower head to expose the interface layer 2 to TDMAH and TDMAS. A Hf—Si adsorption film 5A is thus formed on the interface layer 2. TDMAH and TDMAS are then purged with nitrogen. Instead of TDMAS, tetraethyl orthosilicate (TEOS) may be used as a Si precursor.

Figure 7B:
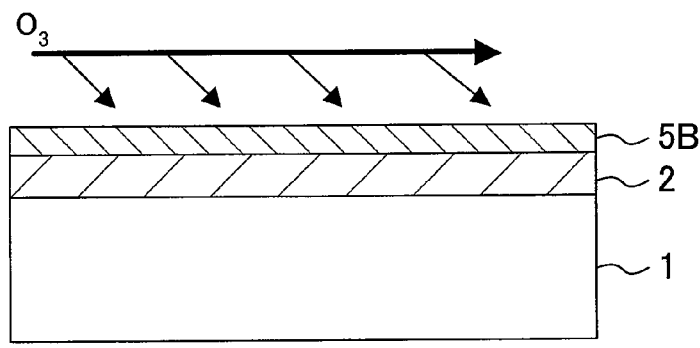

As shown in FIG. 7B, the Hf—Si adsorption layer 5A is then exposed to an ozone ($O_3$) gas having a concentration of 20% as an oxidizing agent to reform the Hf—Si adsorption layer 5A to a hafnium silicate (HfSiO) film 5B. $O_3$ is then purged with nitrogen.

Figure 7C:
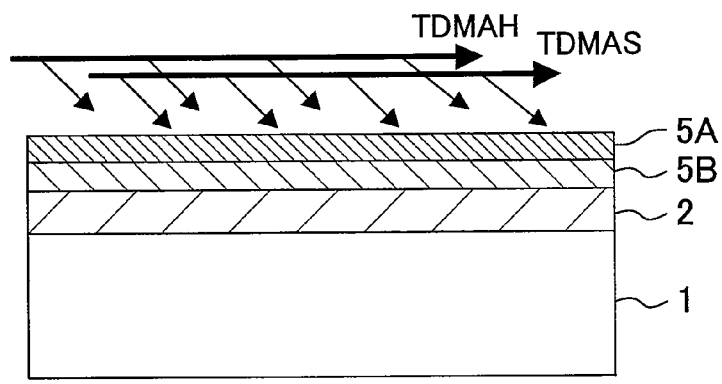

As shown in FIG. 7C, the HfSiO film 5B is then exposed to TDMAH and TDMAS to form a Hf—Si adsorption layer 5A on the HfSiO film 5B. TDMAH and TDMAS are then purged with nitrogen.

Figure 7D:
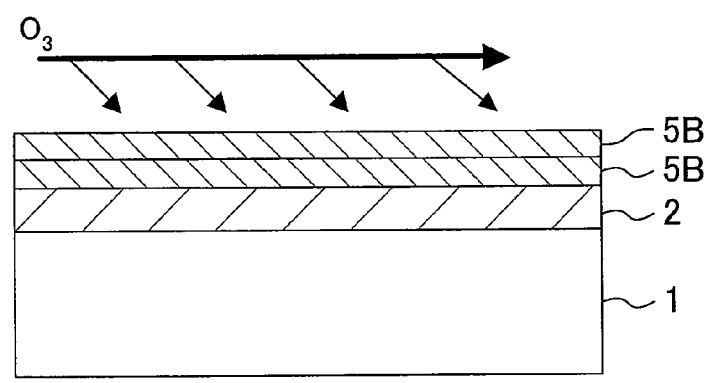

As shown in FIG. 7D, the Hf—Si adsorption layer 5A is then exposed to an ozone ($O_3$) gas having a concentration of 20% to reform the Hf—Si adsorption layer 5A to a HfSiO film 5B. $O_3$ is then purged with nitrogen. The two layers of the hafnium silicate (HfSiO) film 5B are thus formed by two cycles.

Figure 8:
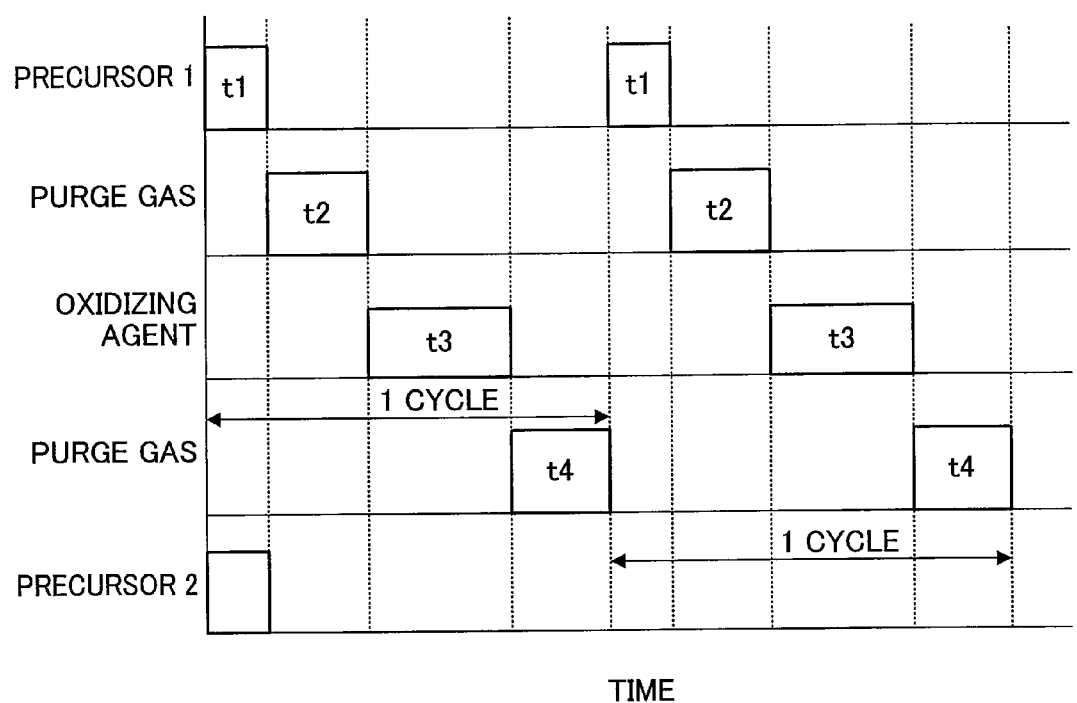
FIG. 8 is a gas sequence diagram in the method for forming a gate insulating film according to the second example embodiment.

FIG. 8 shows a gas introducing sequence in the method for forming a gate insulating film according to the second example embodiment. A precursor 1 is TDMAH and a precursor 2 is TDMAS. The respective exposure times to TDMAH and TDMAS were independently obtained as the saturation time of the film thickness of one cycle. The exposure time to TDMAH is 1 second and the exposure time to TDMAS is 1.5 seconds. In the second example embodiment, the composition ratio of Hf to Si is 1:1, and exposure time t1 to the mixed gas of TDMAH and TDMAS is 1 second in order to adjust the deposition rate. Ozone is used as an oxidizing agent for providing a stoichiometric value to TDMAH and TDMAS. The exposure time to the oxidizing agent (ozone) is herein 5 seconds or more as in the first example embodiment. In the second example embodiment, exposure time t3 is set to 6 seconds. Purge times t2 and t4 with nitrogen are set to 3 seconds.

In the second example embodiment, the deposition temperature is 375° C. and the deposition pressure is $3.99 \times 10^2$ Pa (=3 Torr) in the exposure step to the oxidizing agent. The deposition rate per cycle is therefore 0.11 nm/cycle. 23 cycles are therefore performed to obtain a thickness of 2.6 nm. The time required for film deposition is therefore about a half of that in the first example embodiment, and the productivity is doubled from that of the first example embodiment.

FIGS. 9A through 9D and FIGS. 10A and 10B schematically show a method for forming a hafnium silicate (HfSiO) film according to the first example embodiment and the second example embodiment, respectively.

Figure 9A:
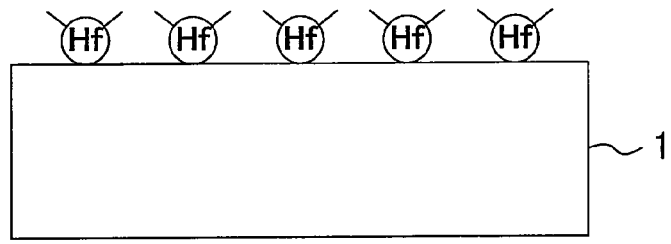
FIGS. 9A, 9B, 9C, and 9D are schematic diagrams showing a deposition model of a high dielectric constant metal silicate (HfSiO) film and sequentially illustrating the steps of the method for forming a gate insulating film according to the first example embodiment.
Figure 9B:
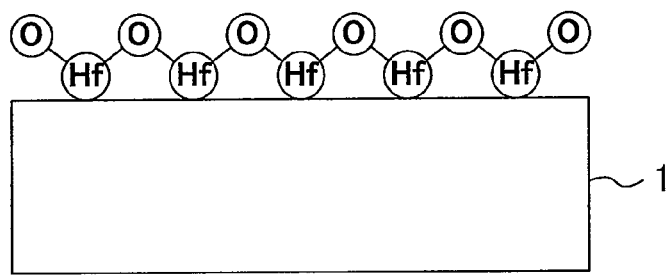
Figure 9C:
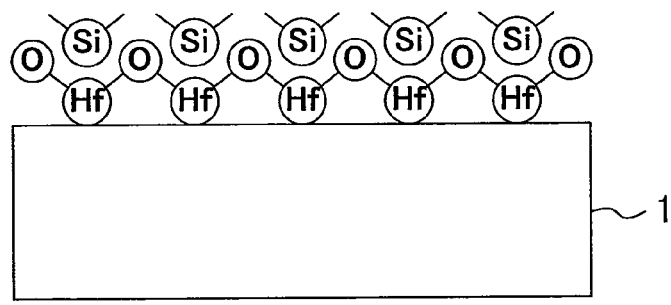
Figure 9D:
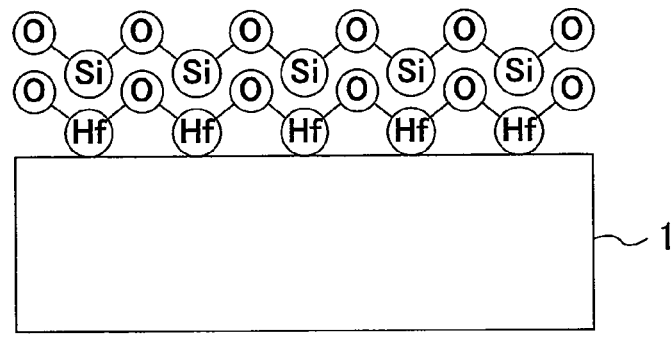
Figure 12A:
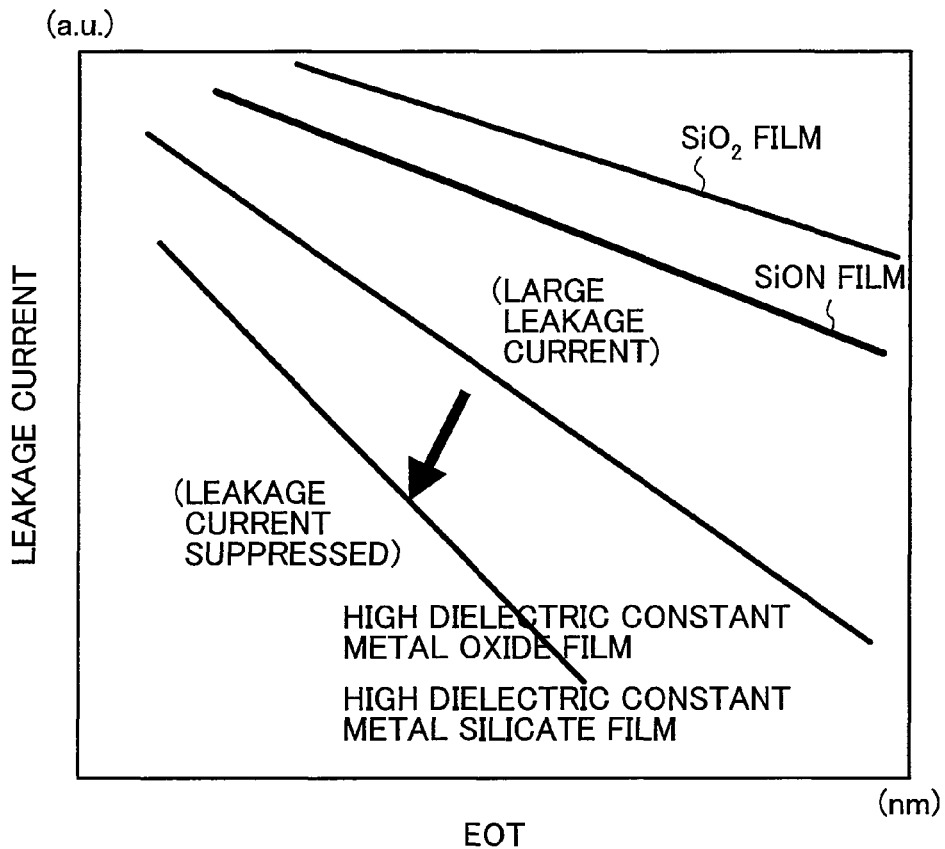
FIG. 12A is a graph showing a relation between the EOT and the leakage current of conventional gate insulating film materials.
Figure 12B:
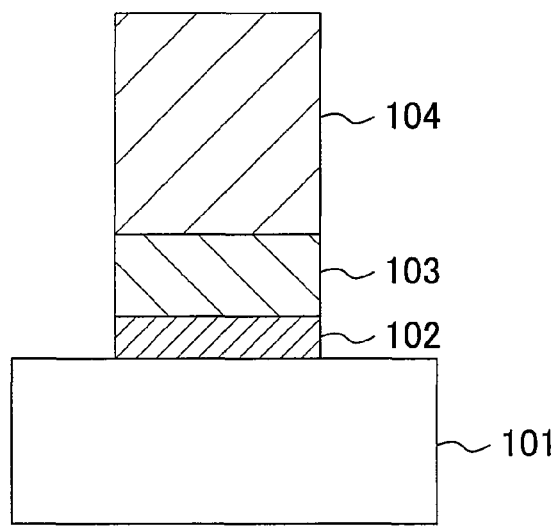
FIG. 12B is a schematic cross-sectional view showing a gate structure using a high dielectric constant metal silicate as a gate insulating film.
Figure 13A:
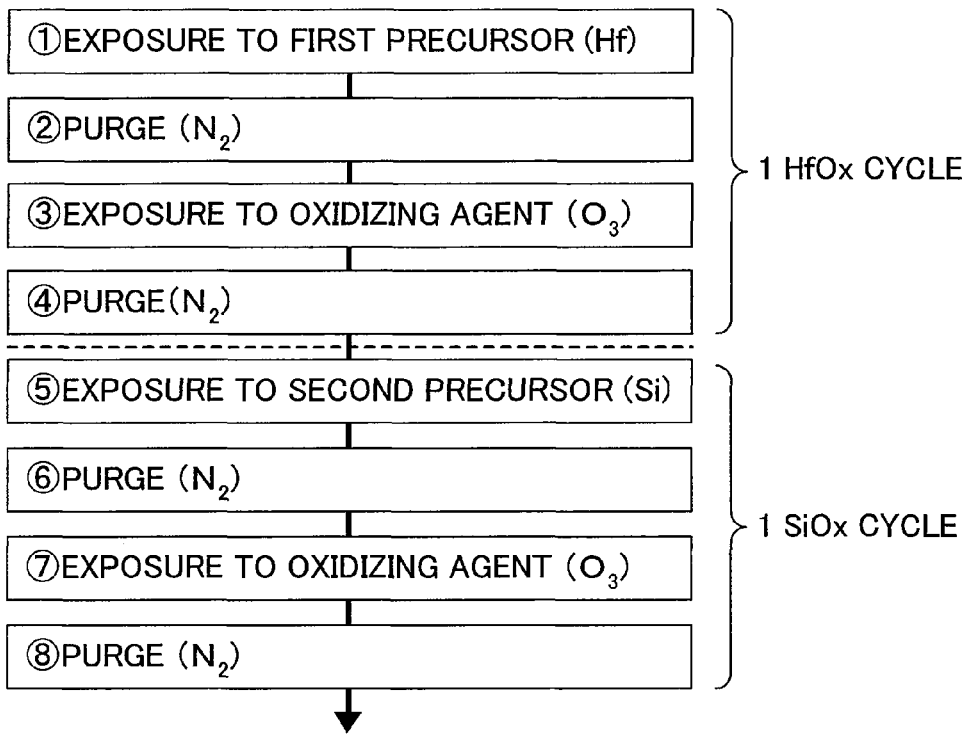
FIG. 13A is a sequence diagram in the case where a gate insulating film made of a high dielectric constant metal silicate is formed by a conventional ALD method.
Figure 13B:
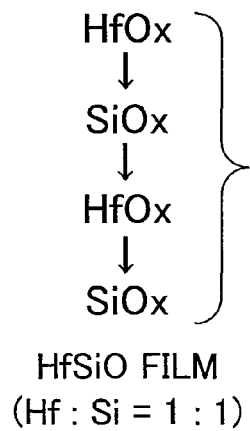
FIGS. 13B and 13C are diagrams illustrating a method for adjusting the composition of a high dielectric constant metal silicate in the conventional ALD method.
Figure 13C:
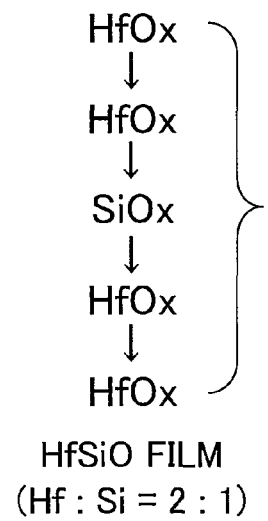
Figure 14A:
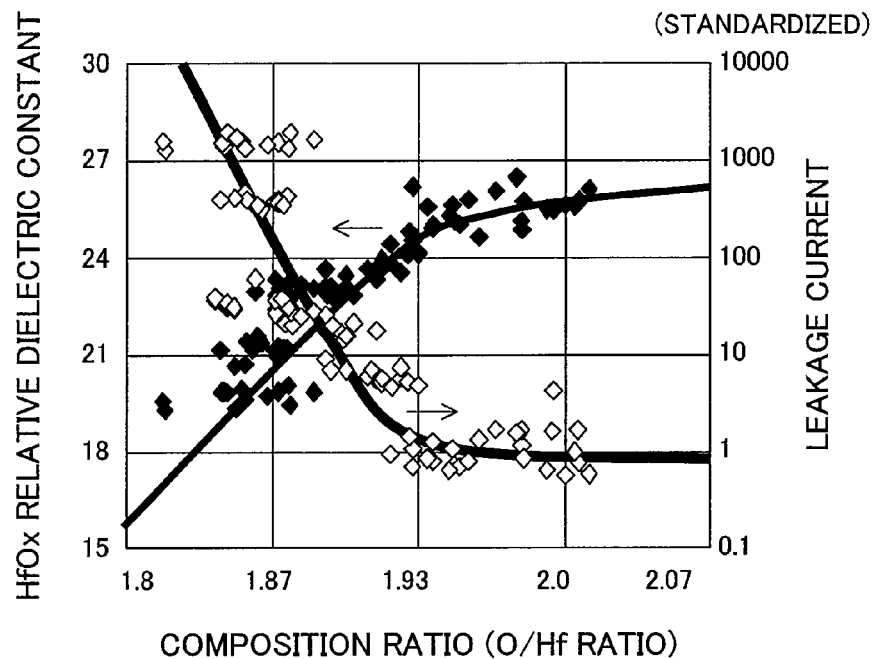
Figure 14B:
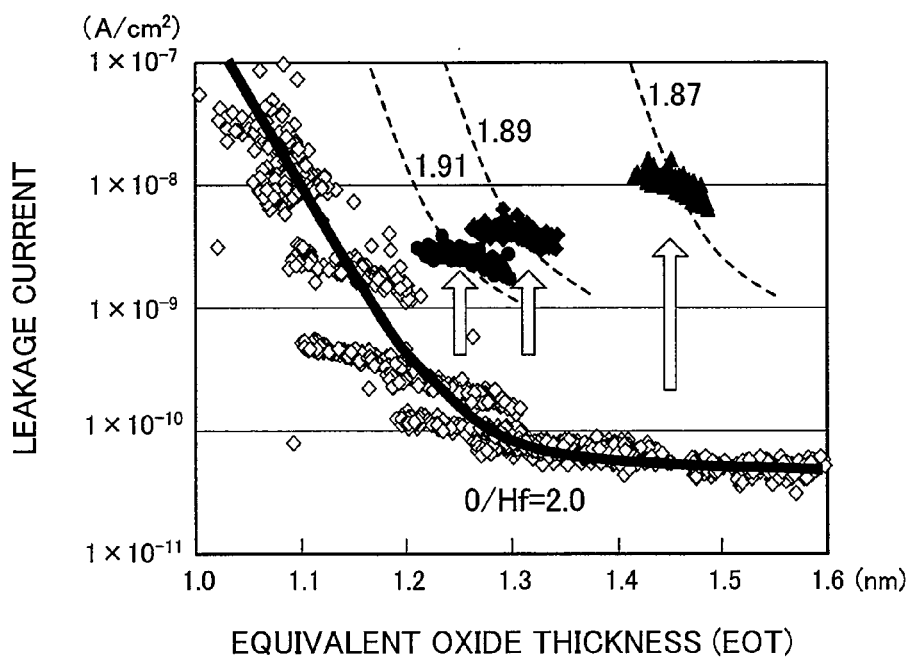

FIGS. 9A through 9D show a method for forming a layered structure by depositing a $HfO_x$ film and a $SiO_x$ film on a layer-by-layer basis by a so-called Nano-laminate method according to the first example embodiment. In FIG. 9A, a main surface of a semiconductor substrate 1 is exposed to a Hf precursor to form a Hf adsorption layer. In FIG. 9B, the Hf precursor is purged with nitrogen and the Hf adsorption layer is then exposed to an oxidizing agent (ozone) to form a $HfO_x$ film. In FIG. 9C, the oxidizing agent is purged with nitrogen and the $HfO_x$ film is then exposed to a Si precursor to form a Si adsorption layer on the $HfO_x$ film. In FIG. 9D, the Si precursor is purged with nitrogen and the Si adsorption layer is then exposed to an oxidizing agent (ozone) to form a HfSiO film. Note that an interface layer on the main surface of the semiconductor substrate 1 is herein omitted.

As described above, in the first example embodiment, it is necessary to optimize the exposure time to the Hf precursor and the exposure time to the Si precursor in the $HfO_x$ film and the $SiO_x$ film and to optimize the respective exposure times to the oxidizing agent for the Hf precursor and the Si precursor. In the method described above, especially the exposure times to the oxidizing agent are individually set to respective optimal values for the Hf and Si precursors, or a longer one of the exposure times to the oxidizing agent is used as the exposure time to the oxidizing agent for both the Hf and Si precursors. In this method, not only a ternary compound film such as HfSiO but a quaternary compound film such as hafnium lanthanum silicate (HfLaSiO) can be formed by changing a layered structure of hafnium oxide ($HfO_x$), silicon oxide ($SiO_x$), and lanthanum oxide ($La_xO_y$) in a thickness direction. In other words, the profiles of Hf, Si, and La can be changed by changing a layered structure of a lower layer, an intermediate layer, and an upper layer in a deposited film. However, it should be understood that, in this case as well, the $HfO_x$ layer, the $SiO_x$ layer, and the $La_xO_y$ layer need to contain oxygen at a stoichiometric value and the respective exposure times to the oxidizing agent can be determined according to the example method of the present invention.

In the second example embodiment, on the other hand, as shown in FIG. 10A, a main surface of a semiconductor substrate 1 is exposed to a mixed atmosphere of a Hf precursor and a Si precursor so that an absorption layer of Hf and Si is absorbed at a predetermined composition ratio on the main surface of the semiconductor substrate 1. As shown in FIG. 10B, the mixed atmosphere of the Hf precursor and the Si precursor is purged with nitrogen, and the adsorption layer of Hf and Si is then exposed to an oxidizing agent (ozone).

Accordingly, in the formation method of the second example embodiment, the semiconductor substrate 1 can be exposed to the Hf precursor and the Si precursor for the same period of time, and the composition of Hf and Si can be adjusted by the mixing ratio of the Hf and Si precursors. When the composition of Hf and Si is adjusted, the exposure time to the Hf precursor and the Si precursor is set to a longer one of the exposure time to the Hf precursor and the exposure time to the Si precursor. Alternatively, after a mixed gas of the Hf precursor and the Si precursor is introduced and the semiconductor substrate 1 is exposed to both precursors for a period equal to a shorter one of the exposure time to the Hf precursor and the exposure time to the Si precursor, the semiconductor substrate 1 is continuously exposed only to the precursor having a longer exposure time.

Regarding the exposure time to the oxidizing agent, a longer one of the exposure time for $HfO_x$ and the exposure time for $SiO_x$ can be used. As described above, although $HiSiO_x$ is formed by a layered structure of $HfO_x$ and $SiO_x$ in the first example embodiment, each layer is made of HfSiO in the second example embodiment. Therefore, the composition of Hf and Si can be changed even in a thickness direction (direction perpendicular to the substrate) by changing the mixing ratio of Hf and Si on a layer-by-layer basis in the step of FIG. 10A.

FIG. 11 shows a relation between the EOT and the leakage current in a high dielectric constant metal silicate film (HfSiO (HF:Si=1:1)) formed in the first example embodiment, the second example embodiment, and a conventional example. In each formation method, the interface layer described in the first example embodiment was formed on the semiconductor substrate, and a HfSiO film having a physical film thickness of 1 nm, 2 nm, and 3 nm was individually deposited on the interface layer. A polycrystalline silicon electrode was deposited on each HfSiO film to form a MIS (metal-insulator-semiconductor) capacitor, and the leakage current of each capacitor and the EOT of each HfSiO film were measured by a high frequency CV (Capacitance-Voltage) method. Note that, in the formation method of the conventional example, the deposition temperature was 350° C., the deposition pressure was $1.99 \times 10^2$ Pa (=1.5 Torr), $HfCl_4$ was used as a Hf precursor, the exposure time to the Hf precursor was 1.5 seconds, $SiCl_4$ was used as a Si precursor, the exposure time to the Si precursor was 0.15 seconds, $O_3$ was used as an oxidizing agent, and the exposure time to the oxidizing agent was 3 seconds.

It can be seen from FIG. 11 that, although the leakage current has higher film thickness (EOT) dependency in the first example embodiment and the second example embodiment than in the conventional example, the leakage current in the first and second example embodiments is reduced by one to three digits from the conventional example.

Note that the leakage current in the conventional example and the leakage current in the example embodiments become close to each other in the in a region where the physical film thickness and the EOT are small, and the difference between the leakage current in the conventional example and the leakage current in the example embodiments increases in a region where the physical film thickness and the EOT are large. This is because a SiON film having a physical film thickness of 1.4 nm and an EOT of 1.1 nm is interposed as the interface layer. The thinner the physical thickness of the high dielectric constant metal silicate film is, the less the contribution of the high dielectric constant metal silicate film becomes.

In the first and second example embodiments and the modifications thereof, a high dielectric constant metal silicate film or a high dielectric constant metal oxide film is deposited on the main surface of the semiconductor substrate 1 with a SiON layer interposed therebetween as the interface layer 2. However, the interface layer 2 is not limited to SiON, and may be made of $SiO_2$. It should be understood that the interface layer 2 is not necessarily be formed, and even when the interface layer 2 is not formed, the effects of the present invention, that is, improvement in electric characteristics of the high dielectric constant metal silicate film or the high dielectric constant metal oxide film, especially reduction in leakage current, can be obtained.

In each of the example embodiments of the present invention, the gate insulating film is deposited in a single-wafer processing apparatus and a shower head is used as a gas supply system. According to the theory of the ALD method, however, the gas supply system is not limited to the shower head, and a laminar flow type may be used.

The present invention is also effective in a batch processing apparatus instead of a single-wafer processing apparatus. However, it is to be understood that the exposure time to each precursor and the exposure time to the oxidizing agent need to be determined by the example method of the present invention according to the number of wafers (semiconductor substrates) per batch and the chamber volume.

A required flow rate of a precursor and required exposure time of the precursor are of course different between a single-wafer processing apparatus having a small chamber volume and a batch processing apparatus having a large chamber volume. However, the exposure time specific to each apparatus can be determined by the method of the present invention.

As has been described above, the method for forming a gate insulating film according to the example embodiments is capable of implementing an excellent film quality with a low leakage current, and is therefore useful for transistors having a gate insulating film made of a high dielectric constant metal silicate or a high dielectric constant metal oxide.

What is claimed is:

1. A method for forming a gate insulating film of a high dielectric constant metal silicate on a semiconductor substrate, comprising the steps of:

(a) with the semiconductor substrate being held at 500° C. or less and a predetermined pressure, exposing the semiconductor substrate to a first precursor containing a metal element of the high dielectric constant metal silicate to form a first adsorption layer of the first precursor on the semiconductor substrate;

(b) purging the first precursor;

(c) exposing the first adsorption layer to an oxidizing agent and thus oxidizing the first adsorption layer to form a metal oxide film from the first adsorption layer;

(d) purging the oxidizing agent;

(e) after the step (d), exposing the metal oxide film to a second precursor containing silicon to form a second adsorption layer of the second precursor on the metal oxide film;

(f) purging the second precursor;

(g) exposing the second adsorption layer to the oxidizing agent and thus oxidizing the second adsorption layer to form a silicon oxide film from the second adsorption layer; and (h) purging the oxidizing agent, wherein a cycle comprised of the steps (a), (b), (c), and (d) is performed at least once to form at least one layer of an atomic layer level of the metal oxide film, and a cycle comprised of the steps (e), (f), (g), and (h) is performed at least once to form at least one layer of an atomic layer level of the silicon oxide film, whereby the high dielectric constant metal silicate is formed, in the step (a), exposure time of the semiconductor substrate to the first precursor is determined by saturation time of a thickness of the one layer of the metal oxide film deposited by the cycle, in the step (c), exposure time of the first adsorption layer to the oxidizing agent is determined by time required for an oxygen content in the metal oxide film to reach 97% or more of a composition that is determined by stoichiometry, in the step (e), exposure time of the metal oxide film to the second precursor is determined by saturation time of a thickness of the one layer of the silicon oxide film deposited in the cycle, and in the step (g), exposure time of the second adsorption layer to the oxidizing agent is determined by time required for an oxygen content in the silicon oxide film to reach 97% or more of a composition that is determined by stoichiometry.

2. The method according to claim 1, wherein the exposure time to the oxidizing agent in each of the steps (c) and (g) is 5 seconds or more per semiconductor substrate, and is set to either the exposure time in the step (c) or the exposure time in the step (g) which has a longer duration of the step.

3. The method according to claim 1, wherein the high dielectric constant metal silicate is a hafnium silicate (HfSiO) or a hafnium lanthanum silicate (HfLaSiO).

4. The method according to claim 1, wherein the oxidizing agent is ozone ($O_3$), water vapor ($H_2O$), heavy water ($D_2O$), or dinitrogen monoxide ($N_2O$), or an oxygen radical.

5. The method according to claim 1, wherein the first precursor is hafnium tetrachloride ($HfCl_4$), tetrakis-ethyl-methyl-amino-hafnium (TEMAH), or tetrakis-di-methyl-amino-hafnium (TDMAH), and the second precursor is silicon tetrachloride ($SiCl_4$), tris-di-methyl-amino-silicon (TDMAS), or tetraethyl orthosilicate (TEOS).

6. The method according to claim 1, wherein in the step (c) of exposing the first adsorption layer to the oxidizing agent, a heating temperature of the semiconductor substrate is a temperature of an atomic layer deposition (ALD) reaction or up to a temperature at which a reaction mode transitions from the atomic layer deposition (ALD) reaction to a chemical vapor deposition (CVD) reaction, and the predetermined pressure is a pressure up to right before in-plane uniformity of the semiconductor substrate is degraded.

7. The method according to claim 1, wherein in the step (c) of exposing the first adsorption layer to the oxidizing agent, a heating temperature of the semiconductor substrate is 300° C. or higher and is such a temperature that a chemical vapor deposition (CVD) reaction does not become dominant, and the predetermined pressure is $1.33 \times 10^2$ Pa to $3.99 \times 10^2$ Pa.

8. A method for forming a gate insulating film of a high dielectric constant metal silicate on a semiconductor substrate, comprising the steps of:

(a) with the semiconductor substrate being held at 500° C. or less and a predetermined pressure, exposing the semiconductor substrate to a first precursor containing a metal element of the high dielectric constant metal silicate and a second precursor containing silicon of the high dielectric constant metal silicate at mixing ratio corresponding to a composition ratio of the dielectric constant metal silicate, thereby forming on the semiconductor subtrate and absorption layer made of the first precursor and the second precursor and having a composition ratio corresponding to the composition ratio of high dielectric constant metal silisate;

(b) purging the first precursor and the second precursor;

(c) exposing the adsorption layer to an oxidizing agent and thus oxidizing the adsorption layer to form a metal silicate film from the adsorption layer; and (d) purging the oxidizing agent, wherein a cycle comprised of the steps (a), (b), (c), and (d) is performed at least once to form at least one layer of an atomic layer level of the metal silicate film, whereby the high dielectric constant metal oxide is formed, in the step (a), exposure time of the semiconductor substrate to the precursor and the second precursor is set to a longer one of respective saturation times of thickness of the one layer deposited by the cycle which are obtained when an oxide film of a metal of the high dielectric constant metal silicate and an oxide film of silicon of the high dielectric constant metal silicate are independently deposited, and in the (c), exposure time of the absorption layer to the oxidizing agent is set to a longer of respective time required for an oxegen content in the oxide film of the metal and oxegen content in the oxide film of silicon to reach 97% or more of a composition that is determined by stoichiometry when the oxide film of the metal of the high dielectric constant metal silicate and the oxide film of silicon of the dielectric constant metal silicate are independently deposited.

9. The method according to claim 8, wherein the high dielectric constant metal silicate is a hafnium silicate (HfSiO) or a hafnium lanthanum silicate (HfLaSiO).

10. The method according to claim 8, wherein the oxidizing agent is ozone ($O_3$), water vapor ($H_2O$), heavy water ($D_2O$), or dinitrogen monoxide ($N_2O$), or an oxygen radical.

11. The method according to claim 8, wherein the first precursor is hafnium tetrachloride ($HfCl_4$), tetrakis-ethyl-methyl-amino-hafnium (TEMAH), or tetrakis-di-methyl-amino-hafnium (TDMAH), and the second precursor is silicon tetrachloride ($SiCl_4$), tris-di-methyl-amino-silicon (TDMAS), or tetraethyl orthosilicate (TEOS).

12. The method according to claim 8, wherein the first precursor and the second precursor contain oxygen.

13. The method according to claim 8, wherein in the step (c) of exposing the adsorption layer to the oxidizing agent, a heating temperature of the semiconductor substrate is a temperature of an atomic layer deposition (ALD) reaction or up to a temperature at which a reaction mode transitions from the atomic layer deposition (ALD) reaction to a chemical vapor deposition (CVD) reaction, and the predetermined pressure is a pressure up to right before in-plane uniformity of the semiconductor substrate is degraded.

14. The method according to claim 8, wherein in the step (c) of exposing the adsorption layer to the oxidizing agent, a heating temperature of the semiconductor substrate is 300° C. or higher and such a temperature that a chemical vapor deposition (CVD) reaction does not become dominant, and the predetermined pressure is $1.33 \times 10^2$ Pa to $3.99 \times 10^2$ Pa.

* * * * *